(12) United States Patent
Nishibayashi et al.

(10) Patent No.: US 10,569,317 B2
(45) Date of Patent: Feb. 25, 2020

(54) SINGLE-CRYSTAL DIAMOND, TOOL USING SAME, AND METHOD OF PRODUCING SINGLE-CRYSTAL DIAMOND

(71) Applicants: Sumitomo Electric Industries, Ltd., Osaka-shi (JP); SUMITOMO ELECTRIC HARDMETAL CORP., Itami-shi (JP)

(72) Inventors: Yoshiki Nishibayashi, Itami (JP); Natsuo Tatsumi, Itami (JP); Takuya Nohara, Itami (JP); Yutaka Kobayashi, Itami (JP); Akihiko Ueda, Itami (JP)

(73) Assignees: Sumitomo Electric Industries, Ltd., Osaka-shi (JP); Sumitomo Electric Hardmetal Corp., Itami-shi (JP)

( * ) Notice: Subject to any disclaimer, the term of this patent is extended or adjusted under 35 U.S.C. 154(b) by 0 days.

(21) Appl. No.: 15/753,241

(22) PCT Filed: Oct. 14, 2016

(86) PCT No.: PCT/JP2016/080499
§ 371 (c)(1),
(2) Date: Feb. 16, 2018

(87) PCT Pub. No.: WO2017/069051
PCT Pub. Date: Apr. 27, 2017

(65) Prior Publication Data
US 2018/0236515 A1 Aug. 23, 2018

(30) Foreign Application Priority Data

Oct. 19, 2015 (JP) .................................. 2015-205482

(51) Int. Cl.
| | |
|---|---|
| *B21C 3/02* | (2006.01) |
| *B23B 27/20* | (2006.01) |
| *C30B 29/04* | (2006.01) |
| *C23C 16/27* | (2006.01) |
| *C23C 16/56* | (2006.01) |
| *C30B 25/02* | (2006.01) |

(52) U.S. Cl.
CPC .............. *B21C 3/025* (2013.01); *B23B 27/20* (2013.01); *C23C 16/27* (2013.01); *C23C 16/56* (2013.01); *C30B 25/02* (2013.01); *C30B 29/04* (2013.01)

(58) Field of Classification Search
CPC combination set(s) only.
See application file for complete search history.

(56) References Cited

U.S. PATENT DOCUMENTS

| | | | |
|---|---|---|---|
| 2001/0043903 A1* | 11/2001 | D'Evelyn | ............... B01J 3/062 423/446 |
| 2003/0131787 A1* | 7/2003 | Linares | ................... C30B 25/02 117/93 |
| 2015/0176155 A1 | 6/2015 | Ueda et al. | |

FOREIGN PATENT DOCUMENTS

| | | |
|---|---|---|
| CN | 104395508 A | 3/2015 |
| GB | 2 441 044 A | 2/2008 |
| GB | 2 482 596 A | 2/2012 |
| JP | H02-268917 A | 11/1990 |

(Continued)

*Primary Examiner* — Erin F Bergner
(74) *Attorney, Agent, or Firm* — Baker Botts L.L.P.; Michael A. Sartori

(57) ABSTRACT

A single-crystal diamond includes a pair of main surfaces facing each other, an impurity concentration being changed along a first direction in each of the main surfaces.

12 Claims, 11 Drawing Sheets

(56) References Cited

FOREIGN PATENT DOCUMENTS

| | | |
|---|---|---|
| JP | H11-71197 A | 3/1999 |
| JP | 2001-293603 A | 10/2001 |
| JP | 2003-303954 A | 10/2003 |
| JP | 2012-176889 A | 9/2012 |
| JP | 2013-035732 A | 2/2013 |
| WO | 03/014427 A1 | 2/2003 |
| WO | 2014/044607 A1 | 3/2014 |

* cited by examiner

SINGLE-CRYSTAL DIAMOND, TOOL USING SAME, AND METHOD OF PRODUCING SINGLE-CRYSTAL DIAMOND

TECHNICAL FIELD

The present invention relates to a single-crystal diamond, a tool using the single-crystal diamond, and a method of producing the single-crystal diamond. The present application claims a priority based on Japanese Patent Application No. 2015-205482 filed on Oct. 19, 2015. The entire content of Japanese Patent Application No. 2015-205482 is incorporated herein by reference.

BACKGROUND ART

A single-crystal diamond has excellent properties such as high hardness, high thermal conductivity, and high light transmitting property, and has been therefore widely used for various products (hereinafter, also referred to as "diamond products") such as tools, optical components, semiconductors, and electronic components. Examples of the tools include a cutting tool, a grinding tool, a wear resisting tool, and the like. For single-crystal diamonds used for such diamond products, natural diamonds and synthetic diamonds can be employed. The natural diamonds have large variation in quality and an amount of supply thereof is not stable. Hence, many synthetic diamonds are also used currently.

As one method of producing such a synthetic diamond, a high temperature high voltage method (HPHT) has been known. Single-crystal diamonds produced by this method has small variation in quality and an amount of supply thereof is stable; however, cost of a production facility used therefor is high, disadvantageously.

Moreover, as another method of producing a synthetic diamond, there are chemical vapor deposition (CVD) methods such as a hot filament CVD (Chemical Vapor Deposition) method, a microwave-excited plasma CVD method, and a DC plasma CVD method. In each of the CVD methods, a single-crystal diamond (epitaxial growth layer) is grown on a surface of a substrate, and then the substrate is separated from the single-crystal diamond. In this way, the single-crystal diamond can be obtained.

For example, Patent Document 1 (Japanese Patent Laying-Open No. 2013-35732) discloses a single-crystal diamond obtained by a vapor deposition method and a tool using the single-crystal diamond. In the single-crystal diamond, at least one or more conductive layers are formed substantially in parallel with a main surface thereof inside the insulative single-crystal diamond and extend to a side surface of the single-crystal diamond.

CITATION LIST

Patent Document

PTD 1: Japanese Patent Laying-Open No. 2013-35732

SUMMARY OF INVENTION (1) A single-crystal diamond according to one embodiment of the present invention is a single-crystal diamond including a pair of main surfaces facing each other, an impurity concentration being changed along a first direction in each of the main surfaces.

(2) A tool according to one embodiment of the present invention is a tool including the single-crystal diamond recited in (1).

(3) A method of producing a single-crystal diamond according to one embodiment of the present invention is a method of producing the single-crystal diamond recited in (1), the method including: obtaining, by a vapor deposition method, a synthetic single-crystal diamond in which an impurity concentration is changed along a crystal growth direction; and cutting the synthetic single-crystal diamond in a direction in which the impurity concentration is changed.

DESCRIPTION OF EMBODIMENTS

Figure 1A:
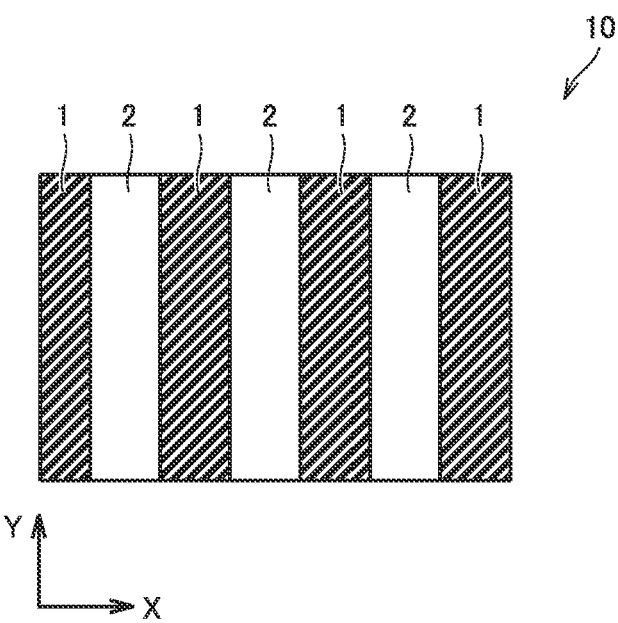
FIG. 1A is a plan view of a single-crystal diamond in a first embodiment.

Problem to be Solved by the Present Disclosure

In the art of Patent Document 1, as the conductive layer in the single-crystal diamond, a boron-doped layer or an ion implantation layer is formed. In the tool using the single-crystal diamond, the single-crystal diamond has a side surface at which the conductive layer is exposed. The side surface is capable of electric contact with an external member, and is arranged to serve as a flank face of the tool. Since the impurity concentrations of the single-crystal diamond layer and the conductive layer are different from each other, crystallinities thereof become different from each other, with the result that hardnesses and wear rates thereof become different from each other. Therefore, as the tool using such a single-crystal diamond is used, the flank face thereof is unevenly worn, thereby damaging a workpiece. Accordingly, a machined surface of the workpiece does not become uniform, disadvantageously.

Therefore, it is an object to provide: a single-crystal diamond allowing for suppression of uneven wear of a tool when used as a tool material; a tool using the single-crystal diamond; and a method of producing the single-crystal diamond.

Advantageous Effect of the Present Disclosure

According to the above-described embodiment, there can be provided: a single-crystal diamond allowing for suppression of uneven wear of a tool when used as a tool material; a tool using the single-crystal diamond; and a method of producing the single-crystal diamond.

DESCRIPTION OF EMBODIMENTS OF THE PRESENT INVENTION

First, embodiments of the present invention are listed and described.

[1] A single-crystal diamond according to one embodiment of the present invention is a single-crystal diamond including a pair of main surfaces facing each other, an impurity concentration being changed along a first direction in each of the main surfaces.

According to the above-described embodiment, there can be obtained a single-crystal diamond allowing for suppression of uneven wear of a tool when used as a tool material.

[2] Preferably, in each of the main surfaces, the impurity concentration is substantially uniform along a second direction orthogonal to the first direction. Here, the expression "the impurity concentration is substantially uniform" means that the concentration falls within a range of −20% to +20% of the average value. Accordingly, there can be obtained a single-crystal diamond allowing for effective suppression of uneven wear of a tool when used as a tool material.

[3] Preferably, in each of the main surfaces, the first direction and the second direction are different in crystal orientation. Accordingly, there can be obtained a single-crystal diamond allowing for effective suppression of uneven wear of the tool when used as a tool material. Among the orientations in the main surface, an orientation causing the largest wear rate or an orientation causing the smallest wear rate more preferably corresponds to the first direction. Further, among the orientations in the main surface, the orientation causing the largest wear rate is orthogonal to the orientation causing the smallest wear rate and one of these orientations preferably corresponds to the first direction.

[4] Preferably, the impurity concentration is more than or equal to 10 ppb and less than or equal to 10000 ppm. When the impurity concentration is less than 10 ppb, a crack is likely to be propagated and a sufficient crack propagation suppressing effect is not obtained, thus resulting in decreased chipping resistance. On the other hand, when the impurity concentration is more than 10000 ppm, wear resistance is decreased remarkably.

[5] Preferably, the impurity concentration has cyclicity along the first direction, and a distance of one cycle in each of the main surfaces is more than or equal to 0.1 μm and less than or equal to 1000 μm. Accordingly, there can be obtained a single-crystal diamond having wear resistance and chipping resistance improved with good balance. Here, the term "cyclicity" indicates that layers having a high impurity concentration and layers having a low impurity concentration are repeated. This is not intended to limit that the lengths of all the cycles are the same. For example, the lengths of the cycles may be changed in the middle of a series of successive cycles. Moreover, in the cyclicity, a starting point may be located at an inner side with a predetermined interval from an end portion of the main surface, rather than from the end portion of the main surface, whereas an end point may be located at an inner side with a predetermined interval from an end portion thereof. That is, the impurity concentration may have cyclicity in at least a portion of the main surface along the first direction. This is because a suitable pattern differs depending on applications of the single-crystal diamond.

The arrangement of the layers having high and low impurity concentrations preferably has centrosymmetry in the main surface. Preferably, in the cyclicity of impurity concentrations, the respective cycles have the same length, and layers having high and low impurity concentrations are repeated at the same interval. Here, the expression "the respective cycles have the same length" means that the respective cycles has the same length with each one cycle corresponding to a "distance in which the impurity concentration is changed from a location with a predetermined high concentration to a location with the predetermined high concentration via a location with a low concentration along the first direction". The expression "layers having high and low impurity concentrations are at the same interval" means that the width of the layer with the high impurity concentration is the same in length as the width of the layer with the low concentration along the first direction. Accordingly, the single-crystal diamond can be suitably applied to various applications. The impurity concentration is preferably not changed abruptly at a boundary between the layer having the high impurity concentration and the layer having the low impurity concentration. This is because tool performance is excellent when the wear rate is not changed abruptly in the tool to which the single-crystal diamond is to be applied.

[6] Preferably, the impurity concentration has a centrosymmetry along the first direction. Accordingly, the single-crystal diamond can be suitably applied to various applications.

[7] Preferably, the single-crystal diamond has an ion implantation layer at a side surface along the second direction. Accordingly, there can be obtained a single-crystal diamond in which the impurity concentration is decreased as the distance from the ion implantation layer is increased.

[8] Preferably, an angle of the side surface relative to each of the main surfaces is more than or equal to 55° and less than or equal to 125°. Accordingly, the impurity concentration in the side surface can be made substantially uniform. Here, the expression "the impurity concentration is substantially uniform" means that the concentration falls within a range of −20% to +20% of the average value.

[9] Preferably, the impurity includes at least one element selected from a group consisting of nitrogen, boron, aluminum, silicon, phosphorus, and sulfur. When these elements exist in the single-crystal diamond, the crystallinity of the single-crystal diamond is changed to suppress propagation of a crack, thereby improving chipping resistance.

[10] A tool according to one embodiment of the present invention is a tool including the single-crystal diamond recited in any one of [1] to [9]. The tool according to the one embodiment of the present invention has wear resistance and chipping resistance both improved with good balance, and has an excellent tool life.

[11] Preferably, the tool is a cutting bite, and an amount of change of the impurity concentration of the single-crystal diamond in a flank face of the cutting bite is smaller than an amount of change of the impurity concentration of the single-crystal diamond in a rake face of the cutting bite. Accordingly, the cutting bite can be suppressed from being unevenly worn, whereby the workpiece can be uniformly machined.

[12] Preferably, the tool is a cutting bite, and in a rake face of the cutting bite, the cutting bite has a relation to cancel out a wear rate difference originating from a plane orientation difference and a wear rate difference originating from an impurity concentration difference. Since the cutting tool is a tool having a curved surface at its cutting portion or wear portion, a plane orientation difference occurs in these portions. Therefore, uneven wear usually occurs in these portions when the tool is used. According to the one embodiment of the present invention, the impurity concentration difference is formed in these portions to cancel out the wear rate difference originating from the plane orientation difference, thereby decreasing uneven wear.

[13] Preferably, the tool is a wire drawing die, and a through hole is formed to extend between the pair of main surfaces of the single-crystal diamond facing each other, along a direction perpendicular to each of the main surfaces of the single-crystal diamond. Accordingly, the wire drawing die can be suppressed from being unevenly worn, whereby the workpiece can be uniformly machined.

[14] Preferably, the tool is a wire drawing die, and in a direction parallel to each of the main surfaces of the single-crystal diamond, the wire drawing die has a relation to cancel out a wear rate difference originating from a plane orientation difference and a wear rate difference originating from an impurity concentration difference. Since the wire drawing die is a tool having a curved surface at its cutting portion or wear portion, a plane orientation difference occurs in these portions. Therefore, uneven wear usually occurs in these portions when the tool is used. According to the one embodiment of the present invention, the impurity concentration difference is formed in these portions to cancel out the wear rate difference originating from the plane orientation difference, thereby decreasing uneven wear.

[15] A method of producing a single-crystal diamond according to one embodiment of the present invention is a method of producing the single-crystal diamond recited in any one of [1] to [9], the method including: obtaining, by a vapor deposition method, a single-crystal diamond in which an impurity concentration is changed along a crystal growth direction; and cutting the single-crystal diamond in a direction in which the impurity concentration is changed.

According to the method of producing the single-crystal diamond according to the one embodiment of the present invention, there can be obtained a single-crystal diamond allowing a workpiece to be machined more uniformly when used as a tool material.

DETAILS OF EMBODIMENTS OF THE PRESENT INVENTION

The following describes specific examples of a single-crystal diamond, a tool, and a method of producing the single-crystal diamond according to embodiments of the present invention with reference to figures. It should be noted that the present invention is defined by the terms of the claims, rather than these illustrations, and is intended to include any modifications within the scope and meaning equivalent to the terms of the claims. In the present specification, an individual orientation is represented by [ ], a group orientation is represented by < >, and an individual plane is represented by ( ) and a group plane is represented by { }.

First Embodiment

Figure 1B:
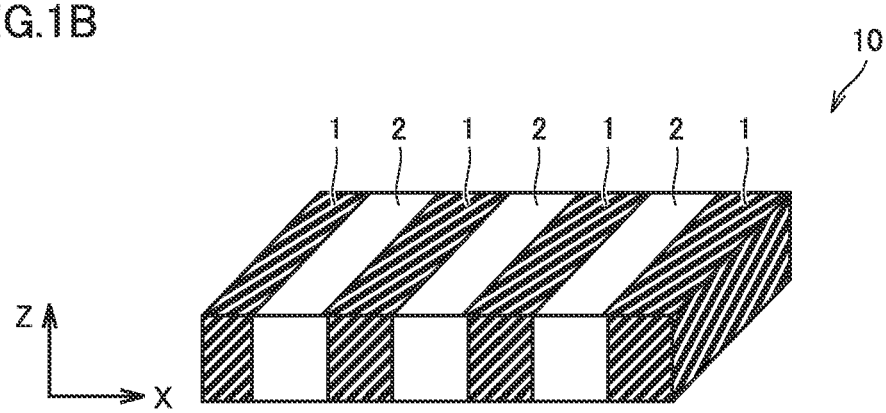
FIG. 1B is a perspective view of the single-crystal diamond in the first embodiment.
Figure 2:
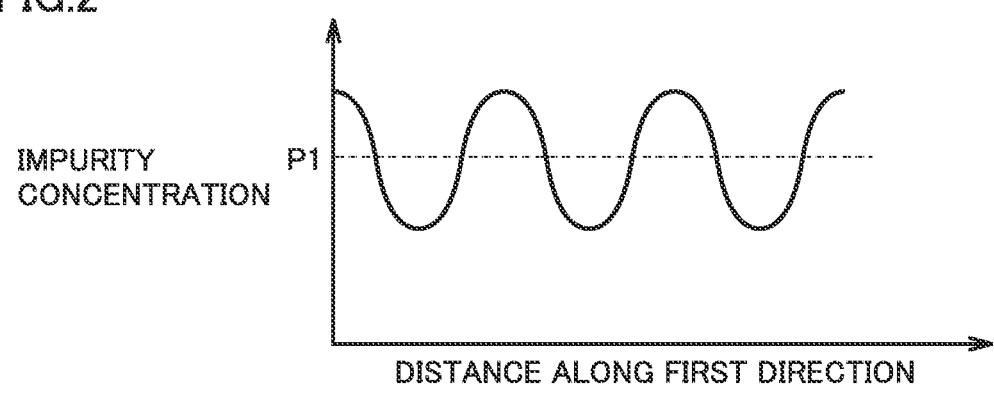
FIG. 2 is a graph showing an impurity concentration in a main surface of the single-crystal diamond of FIG. 1A and FIG. 1B.

The following describes a single-crystal diamond of a first embodiment with reference to FIG. 1A, FIG. 1B, and FIG. 2. FIG. 1A is a plan view of a single-crystal diamond in the first embodiment and FIG. 1B is a perspective view of the single-crystal diamond in the first embodiment. FIG. 2 is a graph showing an impurity concentration in a main surface of the single-crystal diamond of FIG. 1A and FIG. 1B. The term "plan view" refers to a figure when viewed from above the main surface of the single-crystal diamond. In the present specification, the main surface means a surface having the largest area among the surfaces of the single-crystal diamond.

As shown in FIG. 1A and FIG. 1B, single-crystal diamond 10 includes a pair of main surfaces facing each other. In each of the main surfaces, impurity high concentration regions 1 and impurity low concentration regions 2 are alternately disposed adjacent to one another. Impurity high concentration regions 1 extend in the form of strips along a second direction (Y axis direction) orthogonal to a first direction (X axis direction). Impurity low concentration regions 2 extend in the form of strips along the second direction. Each of FIG. 1A and FIG. 1B shows that the shape of single-crystal diamond 10 is a rectangular parallelepiped shape; however, the shape of single-crystal diamond 10 is not limited particularly as long as single-crystal diamond 10 is shaped to have a pair of main surfaces facing each other. In each of FIG. 1A and FIG. 1B, the plurality of impurity high concentration regions 1 and the plurality of impurity low concentration regions 2 are disposed. The number of the respective regions is not limited particularly as long as impurity high concentration regions 1 and impurity low concentration regions 2 are disposed alternately. One impurity high concentration region 1 and one impurity low concentration region 2 may be provided.

In the main surface of single-crystal diamond 10, each of impurity high concentration regions 1 and impurity low concentration regions 2 extending in the form of strips has a length (width) of preferably more than or equal to 1 µm and less than or equal to 1000 µm, and more preferably, more than or equal to 5 µm and less than or equal to 300 µm along the first direction (X axis direction). The range of the above-described length is adapted to be correlated with a curvature of a curved surface formed in a wear surface of a tool using the single-crystal diamond. Therefore, in the tool using such a single-crystal diamond, an uneven wear rate (uneven wear) originating from a plane orientation difference can be suppressed at a specific portion of the wear surface. It should be noted that the width of impurity high concentration region 1 may be the same as or different from the width of impurity low concentration region 2.

FIG. 2 is a graph showing an exemplary change of the impurity concentration along the first direction (X axis direction) in the main surface of single-crystal diamond 10 of FIG. 1A and FIG. 1B. In FIG. 2, a distance along the first direction means a distance along the first direction from a left side surface of single-crystal diamond 10 of FIG. 1A and FIG. 1B that is along the second direction. As shown in FIG. 2, in the main surface, the impurity concentration is changed along the first direction. Specifically, regions having impurity concentrations higher than a predetermined concentration P1 and regions having impurity concentrations lower than predetermined concentration P1 appear alternately at certain cyclicity along the first direction. In FIG. 2, the regions having the impurity concentrations more than or equal to predetermined concentration P1 correspond to impurity high concentration regions 1 of FIG. 1A and FIG. 1B, and the regions having the impurity concentrations lower than predetermined concentration P1 correspond to impurity low concentration regions 2 of FIG. 1A and FIG. 1B. Here, predetermined concentration P1 falls within a range of more than or equal to 10 ppb to less than or equal to 10000 ppm, and is an intermediate value between the maximum value of the impurity high concentration regions and the minimum value of the impurity low concentration regions. Each of the impurity high concentration regions is a region having an impurity concentration falling within a range of the maximum value to 60% of the maximum value, and has a width falling within a range of more than or equal to 0.5 µm to less than or equal to 500 µm. Each of the impurity low concentration regions is a region having an impurity concentration of less than 60% of the maximum value. The value of P1 is substantially at a boundary between the value of the impurity high concentration region and the value of the impurity low concentration region. When the minimum value of the impurity low concentration region is less than 20% of the maximum value of the impurity high concentration region, the value of P1 falls within the range of the impurity low concentration region.

The impurity concentration in the main surface of single-crystal diamond 10 is a value measured by secondary ion mass spectrometry (SIMS). In the SIMS analysis, a concentration is determined at a position to which sputtering has been performed by 0.5 µm from the outermost surface of a sample under conditions that $Cs^+$ is used as primary ions, acceleration voltage is 15 kV, and a detection region is 35 µmϕ. The concentration is quantified through a comparison with a separately prepared standard sample (diamond single crystal having a known impurity concentration and produced by ion implantation). When the value of the impurity concentration is small, the measured value may be deviated from its actual value due to device precision. In order to obtain a more accurate value, it is preferable to find an average value of values (depths and positions) measured at a depth of 0.5 µm in at least three points separated from one another by at least 100 µm.

In the main surface of single-crystal diamond 10, the impurity concentration along the second direction (Y axis direction) orthogonal to the first direction (X axis direction) is preferably substantially uniform. Here, the expression "the impurity concentration is substantially uniform" means that the concentration falls within a range of −20% to +20% of the average value.

In single-crystal diamond 10, the impurity concentration along the depth direction, which is a direction perpendicular to the main surface, is preferably substantially uniform. Here, the expression "the impurity concentration is substantially uniform" means that the concentration falls within a range of −20% to +20% of the average value.

A plane with the substantially uniform impurity concentration may be the same as or different from a crystal growth plane. Depending on a method of producing the single-crystal diamond, the plane with the substantially uniform impurity concentration may be inclined relative to the growth plane. The main surface of single-crystal diamond 10 is preferably substantially perpendicular to the plane with the substantially uniform impurity concentration, but may be inclined by ±35° from the perpendicularity. In a cutting bite, a flank face is inclined relative to a rake face. Therefore, when the main surface of the single-crystal diamond is inclined relative to the plane with the substantially uniform impurity concentration by ±35° from the perpendicularity and the main surface serves as the rake face, the plane with the substantially uniform impurity concentration can serve as the flank face.

In the main surface of single-crystal diamond 10, the impurity concentration is preferably more than or equal to 10 ppb and less than or equal to 10000 ppm. When the impurity concentration is less than 10 ppb, a crack is likely to be propagated and a sufficient crack propagation suppressing effect is not obtained, thus resulting in decreased chipping resistance. On the other hand, when the impurity concentration is more than 10000 ppm, wear resistance is decreased remarkably. The impurity concentration is more preferably more than or equal to 100 ppb and less than or equal to 1000 ppm, and is further preferably more than or equal to 500 ppb and less than or equal to 100 ppm.

In the main surface of single-crystal diamond 10, the maximum value of the impurity concentration is preferably more than or equal to 1 ppm and less than or equal to 10000 ppm, and is more preferably more than or equal to 5 ppm and less than or equal to 1000 ppm. Moreover, the minimum value of the impurity concentration is preferably more than or equal to 10 ppb and less than or equal to 100 ppm, and is more preferably more than or equal to 100 ppb and less than or equal to 50 ppm. A ratio (minimum value/maximum value) of the minimum value to the maximum value of the impurity concentration is preferably more than or equal to $10^{-6}$ and less than 0.8, and is more preferably more than or equal to $10^{-4}$ and less than or equal to 0.5. With this, when the single-crystal diamond is used as a material of a machining tool, uneven wear in the material originating from the impurity concentration difference is canceled out by uneven wear originating from the plane orientation difference, whereby uneven wear can be suppressed as a whole of the tool.

In the main surface of single-crystal diamond 10, the impurity concentration has cyclicity along the first direction, and a distance of one cycle in the main surface is preferably more than or equal to 2 μm and less than or equal to 2000 μm, and is further preferably more than or equal to 10 μm and less than or equal to 600 μm. Here, the distance of one cycle in the main surface corresponds to a total of distances (widths) of one adjacent pair of impurity high concentration region 1 and impurity low concentration region 2 in the X axis direction in FIG. 1A and FIG. 1B. Here, with at least one cycle in single-crystal diamond 10, the effect of reducing uneven wear can be obtained. The number of the cycles is more preferably represented by n+0.5 (n indicates an integer) (for example, 1.5, 2.5, or the like). This is due to the following reason: in this case, when an impurity high concentration region and an impurity low concentration region both having the same width are formed in one cycle, the impurity concentrations can be symmetrical with respect to an axis represented by a line passing through the center of the main surface. For the same reason, only the central portion of the main surface may be constituted of the impurity high concentration region or the impurity low concentration region. This case is suitable for use in a tool provided with a hole at its center (perforated tool such as a wire drawing die).

The impurity in the main surface of single-crystal diamond 10 preferably includes at least one element selected from a group consisting of nitrogen, boron, aluminum, silicon, phosphorus, and sulfur. When these elements exist in single-crystal diamond 10, the crystallinity of single-crystal diamond 10 is changed to suppress propagation of a crack, thereby improving chipping resistance. Among them, the impurity preferably includes at least one of nitrogen and boron. Further, in the impurity, it is more preferable that a ratio of carbon and a mixed substitutional impurity is smaller. This ratio is preferably less than or equal to 20%, and is more preferably less than or equal to 10%, for example. This leads to an excellent mechanical characteristic (a characteristic of being hard and being less likely to be chipped) as a tool. The ratio of the substitutional impurity can be determined from a value (total impurity concentration) measured by secondary ion mass spectrometry (SIMS) and a value measured by the electron spin resonance method (ESR) (concentration of the substitutional impurity).

In the main surface of the single-crystal diamond, the plane orientation in the direction in which the impurity concentration is substantially uniform is preferably different from the plane orientation in the direction in which the impurity concentration is changed. More preferably, an orientation causing the smallest wear rate corresponds to the direction in which the impurity concentration is substantially uniform or the direction in which the impurity concentration is changed. Generally, the wear rate differs depending on a plane orientation or an impurity concentration. Hence, by appropriately combining the wear rate difference originating from the plane orientation difference with the wear rate difference originating from the impurity concentration difference, the respective wear rate differences (uneven wear) can be canceled out.

When the direction in which the impurity concentration is uniform is configured to coincide with the plane orientation in which wear is more likely to occur in the case of producing a perforated tool such as a wire drawing die, it is preferable to configure such that: the direction in which the impurity concentration is changed coincides with the plane orientation in which wear is less likely to occur; the center of the hole is located in a layer having an impurity concentration with which wear is less likely to occur (impurity low concentration layer because wear is generally less likely to occur as an impurity concentration is lower); and a layer having an impurity concentration with which wear is more likely to occur (impurity high concentration layer) is in contact with or overlaps with an end of the hole. In the case of producing a cutting bite, it is preferable to configure such that the tip of the cutting tool is in contact with or overlaps with the layer having the impurity concentration with which wear is more likely to occur (impurity high concentration layer).

Meanwhile, when the direction in which the impurity concentration is uniform is configured to coincide with the plane orientation in which wear is less likely to occur and the direction in which the impurity concentration is changed is configured to coincide with the plane orientation in which wear is more likely to occur in the case of producing a perforated tool such as a wire drawing die, it is preferable to configure such that: the center of the hole is located in the layer having the impurity concentration with which wear is more likely to occur (impurity high concentration layer because wear is generally less likely to occur as an impurity concentration is lower); and the layer having the impurity concentration with which wear is less likely to occur (impurity low concentration layer) is in contact with or overlaps with an end of the hole. In the case of producing a cutting bite, it is preferable to configure such that the tip of the cutting tool is in contact with or overlaps with the layer having the impurity concentration with which wear is less likely to occur (impurity low concentration layer).

Figure 3A:
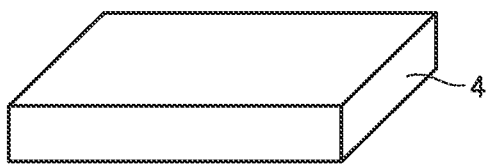
FIG. 3A shows one step of an exemplary method of producing the single-crystal diamond in the first embodiment.
Figure 3B:
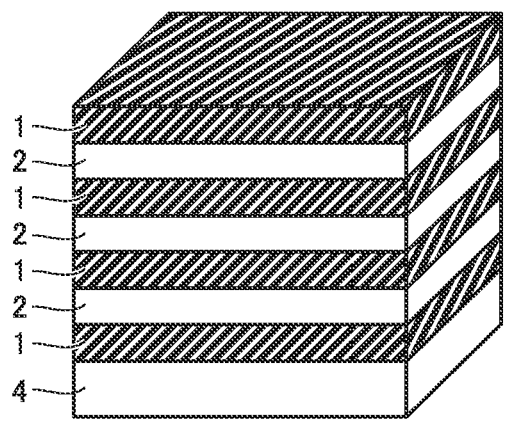
FIG. 3B shows a step, different from the foregoing step, of the exemplary method of producing the single-crystal diamond in the first embodiment.
Figure 3C:
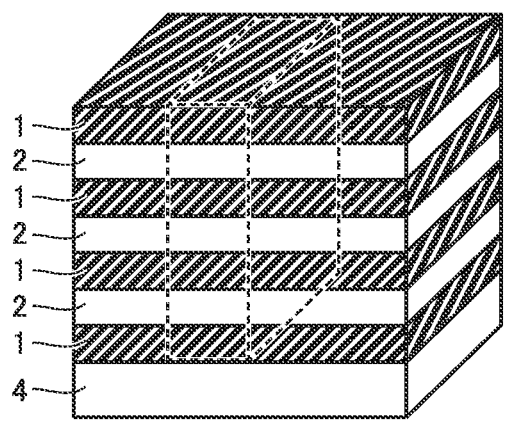
FIG. 3C shows a step, different from the foregoing step, of the exemplary method of producing the single-crystal diamond in the first embodiment.

The following describes an exemplary method of producing the single-crystal diamond in the first embodiment with reference to FIG. 3A to FIG. 3C. Each of FIG. 3A to FIG. 3C shows the exemplary method of producing the single-crystal diamond in the first embodiment. In the present embodiment, the method of producing the single-crystal diamond includes: obtaining, by a vapor deposition method, a synthetic single-crystal diamond in which an impurity concentration is changed along a crystal growth direction; and cutting the synthetic single-crystal diamond in a direction in which the impurity concentration is changed.

First, as shown in FIG. 3A, a single-crystal diamond substrate 4 is prepared. As single-crystal diamond substrate 4, there can be used a single-crystal substrate (type Ib) having a flat plate shape and composed of a diamond produced by the high temperature high voltage method, for example. Single-crystal diamond substrate 4 has: main surfaces constituted of a (100) plane; and side surfaces perpendicular to the main surfaces and constituted of a (001) plane and a (010) plane. It should be noted that the shape of single-crystal diamond substrate 4 is not limited in particular and a desired shape can be employed therefor. Further, the main surface of the diamond single crystal substrate is preferably smoothed by mechanical polishing or the like and is preferably etched by about 1 μm to 50 μm by reactive ion etching.

Next, single-crystal diamond substrate 4 is placed in a chamber of a CVD apparatus, and the vapor deposition method is employed to obtain a synthetic single-crystal diamond having an impurity concentration changed along the crystal growth direction (FIG. 3B). Specifically, while introducing gas including carbon into the chamber, a synthetic single-crystal diamond is grown epitaxially on the main surface of single-crystal diamond substrate 4 through the CVD method.

The carbon in the gas serves as a carbon source for the synthetic single-crystal diamond. Examples of the gas including carbon include: $CH_4$, $C_2H_6$, $C_2H_4$, $C_2H_2$, $CH_3OH$, $C_2H_5OH$, $(CH_3)_2CO$, and the like. It should be noted that in addition to these gases, CO and $CO_2$ can also be used. Among these, it is preferable to use $CH_4$ because carbon radical to be a precursor of the formed diamond film is likely to be generated.

By simultaneously introducing nitrogen gas into the chamber together with the gas including the carbon, nitrogen can be introduced as an impurity in the synthetic single-crystal diamond. By controlling an amount of addition of the nitrogen gas in the gas to be introduced into the chamber, the impurity nitrogen concentration in the synthetic single-crystal diamond can be changed along the crystal growth direction. The impurity concentration can be changed along the growth direction by changing total pressure, supplied power, substrate temperature, and the like in addition to the flow rate ratio of the added gases.

In the case where boron, aluminum, silicon, phosphorus, or sulfur is introduced into the synthetic single-crystal diamond as the impurity, diborane gas ($B_2H_6$), trimethyl-aluminum (($CH_3$)$_3$Al), silane gas ($SiH_4$), phosphine gas ($PH_3$), hydrogen sulfide ($H_2S$), and the like can be used. In the case of the elements other than aluminum, generally known organic gas can be used.

While introducing the above-described gas, pressure in the chamber is controlled to be, for example, 6.6 kPa to 26.6 kPa, microwave power is supplied to heat to an internal chamber temperature of 800° C. to 1200° C., and then the synthetic single-crystal diamond is epitaxially grown on the main surface of single-crystal diamond substrate 4. For a method of forming the epitaxial growth layer, a microwave plasma CVD method (MP-CVD method), a hot filament (HF) CVD method, a DC plasma method, or the like can be used, for example.

Next, as indicated by a broken line of FIG. 3C, the synthetic single-crystal diamond is cut in the direction in which the impurity concentration is changed. Here, the expression "cut in the direction in which the impurity concentration is changed" means to cut across planes with uniform impurity concentrations. This is not limited to cutting in the direction perpendicular to the planes with the substantially uniform impurity concentrations, and includes cutting at a predetermined angle (for example, ±35°) relative to the planes with the substantially uniform impurity concentrations. This is due to the following reason: depending on an application of the single-crystal diamond, the planes with the substantially uniform impurity concentrations may favorably cross the cut surface at an angle other than the perpendicularity. The synthetic single-crystal diamond can be cut by laser cutting.

Next, the synthetic single-crystal diamond is separated from diamond single-crystal substrate 4 using a laser, thereby obtaining a single-crystal diamond. Instead of using the laser, they can be separated by electrochemical etching. In this case, it is necessary to form a graphite layer in the substrate in advance by ion implantation before performing crystal growth. The obtained single-crystal diamond has, as a main surface, a surface substantially parallel to the crystal growth direction of the synthetic single-crystal diamond. Therefore, in this case, the impurity concentration is changed along the crystal growth direction in the main surface of the single-crystal diamond.

The following describes another method of producing a single-crystal diamond in the first embodiment. This method is the same as the above-described method except for a manner of changing the impurity concentration. The following describes the manner of changing the impurity concentration. In the above-described method, the main surface of the diamond single crystal substrate is flat and the direction of change of the impurity concentration is perpendicular to the growth plane. On the other hand, in this method, the substrate is subjected to a special process, with the result that the direction of change of the impurity concentration does not necessarily correspond to the direction perpendicular to the growth plane.

First, a substrate having an off angle is prepared as the diamond single crystal substrate. On the main surface of this substrate, one or more line-shaped protrusions are formed. Each of the protrusions preferably has a height of less than or equal to 10 μm. An aspect ratio (height/width) of the protrusion is preferably less than or equal to 1. When there are a plurality of protrusions, a protrusion interval (interval between adjacent protrusions) is preferably larger than the height of each of the protrusions. When the diamond is grown on the main surface of this substrate, a high-order plane orientation different from that of the main surface of the substrate occurs at a side surface of the protrusion and an upper portion of the protrusion corresponds to a just plane with no off angle. There occurs a difference in impurity content ratio between the high-order plane of the side surface of the protrusion and the main surface of the substrate, and crystal growth rates differ therebetween, with the result that strip-shaped portions having different impurity concentrations are formed to have an inclination relative to the main surface. This inclination (θd) can be determined by tan(θd)=Rv/Rh, using a ratio of a growth rate (Rv) in the direction perpendicular to the main surface and a growth rate (Rh) of the high-order plane in the lateral direction. That is, in this production method, there occurs a plane inclined by θd relative to the crystal growth plane and having a substantially uniform impurity concentration.

Second Embodiment

Figure 4A:
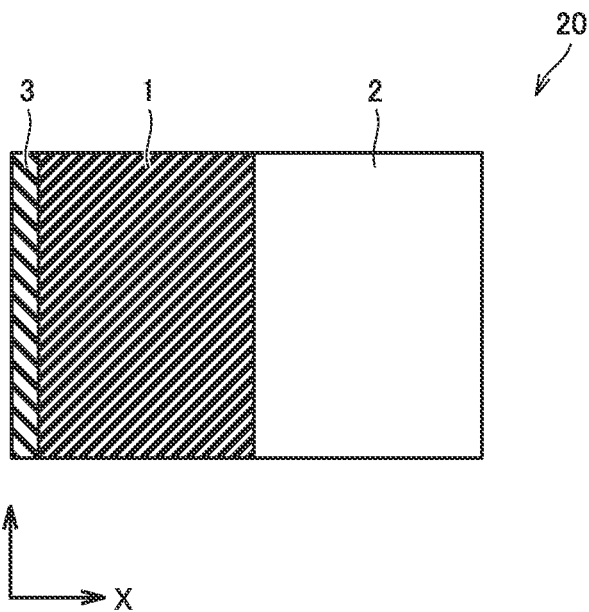
FIG. 4A is a plan view of a single-crystal diamond in a second embodiment.
Figure 4B:
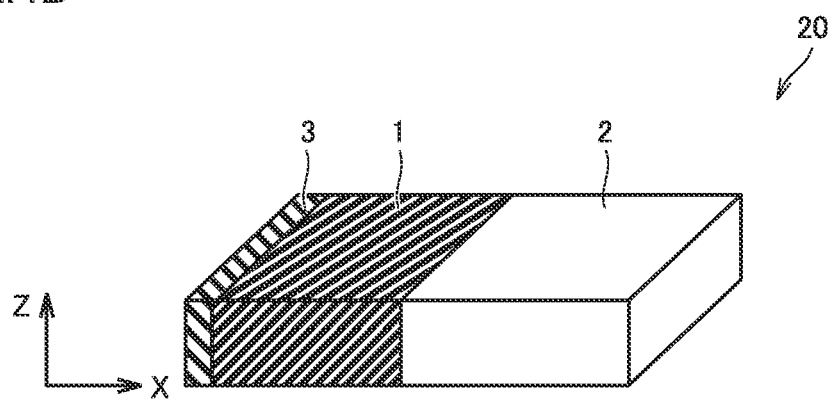
FIG. 4B is a perspective view of the single-crystal diamond in the second embodiment.
Figure 5:
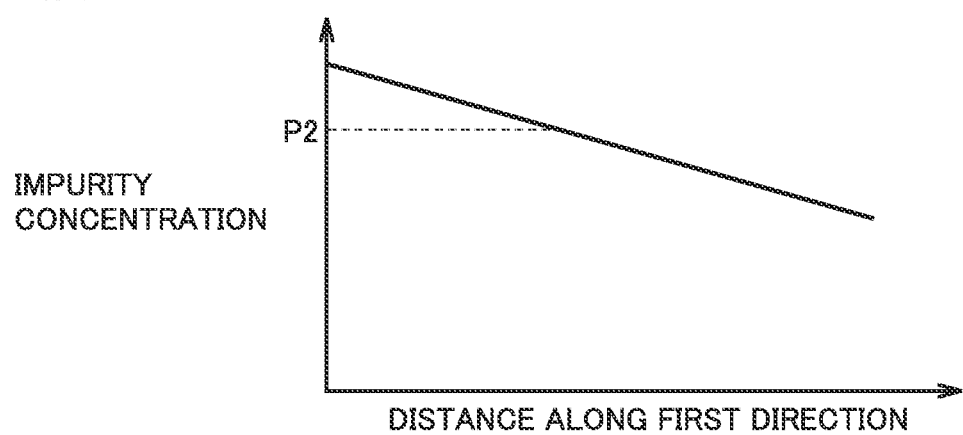
FIG. 5 is a graph showing an impurity concentration in a main surface of the single-crystal diamond of FIG. 4A and FIG. 4B.

The following describes a single-crystal diamond of a second embodiment with reference to FIG. 4A, FIG. 4B, and FIG. 5. FIG. 4A is a plan view of the single-crystal diamond and FIG. 4B is a perspective view of the single-crystal diamond in the second embodiment. FIG. 5 is a graph showing an impurity concentration in a main surface of the single-crystal diamond of FIG. 4A and FIG. 4B. The term "plan view" refers to a figure when viewed from above the main surface of the single-crystal diamond.

As shown in FIG. 4A and FIG. 4B, single-crystal diamond 20 has a rectangular parallelepiped shape including a pair of main surfaces facing each other. In each of the main surfaces, an ion implantation layer 3, an impurity high concentration region 1, and an impurity low concentration region 2 each extending along the Y axis direction in the form of a strip are disposed adjacent to one another in this order. Ion implantation layer 3 is located at an end portion of single-crystal diamond 20 in the X axis direction, and is disposed along one side surface substantially parallel to the Y axis direction.

FIG. 5 is a graph showing an exemplary change of the impurity concentration along the first direction (X axis direction) in the main surface of single-crystal diamond 20 of FIG. 4A and FIG. 4B. In FIG. 5, a distance along the first direction means a distance along the first direction from the side surface of single-crystal diamond 20 of FIG. 4A and FIG. 4B at which ion implantation layer 3 exists. As shown in FIG. 5, in the main surface, the impurity concentration is changed along the first direction. Specifically, the impurity concentration is gradually decreased along the first direction from ion implantation layer 3 existing at the side surface of diamond single crystal 20 toward impurity low concentration region 2. In FIG. 5, a region having an impurity concentration more than or equal to a predetermined concentration P2 correspond to ion implantation layer 3 and impurity high concentration region 1 of FIG. 4A and FIG. 4B, and a region having an impurity concentration lower than predetermined concentration P2 correspond to impurity low concentration region 2 of FIG. 4A and FIG. 4B. Here, predetermined concentration P2 falls within a range of more than or equal to 10 ppb to less than or equal to 10000 ppm, and is an intermediate value between the maximum value of the impurity high concentration region and the minimum value of the impurity low concentration region. The impurity high concentration region is a region having an impurity concentration falling within a range of the maximum value to 60% of the maximum value, and has a width falling within a range of more than or equal to 0.5 µm to less than or equal to 500 µm. The impurity low concentration region is a region having an impurity concentration of less than 60% of the maximum value. The value of P2 is substantially at a boundary between the value of the impurity high concentration region and the value of the impurity low concentration region. When the minimum value of the impurity low concentration region is less than 20% of the maximum value of the impurity high concentration region, the value of P2 falls within the range of the impurity low concentration region.

The ion included in ion implantation layer 3 is preferably at least one selected from a group consisting of carbon ion, boron ion, nitrogen ion, argon ion, phosphorous ion, silicon ion, and sulfide ion. This is due to the following reason: when growing a synthetic single-crystal diamond on the ion implantation layer, these ions are likely to be mixed in the synthetic single-crystal diamond, whereby an impurity concentration gradient is likely to be formed. The ion species in the ion implantation may be the same as or different from the ion species in the diamond with the concentration gradient.

The following describes an exemplary method of forming the impurity concentration gradient. First, a predetermined amount of ions (preferably, a dose amount of $3 \times 10^{16}$ cm$^{-2}$) or more are implanted into the substrate. Next, as an initial state, a single-crystal diamond is synthesized while slightly etching the substrate. In doing so, the implanted ions in the substrate are released to atmosphere. In synthesizing the diamond on the substrate, the single-crystal diamond is formed with the implanted ions in the atmosphere being slightly included therein. As time passes, a new diamond is formed on the substrate, with the result that the implanted ions in the substrate are no longer released into the atmosphere. Accordingly, an amount of the implanted ions in the atmosphere is also decreased gradually. Therefore, the implanted ions to be included in the single-crystal diamond are also decreased gradually. In this way, the impurity concentration gradient is formed in the synthetic single-crystal diamond.

The following describes another exemplary method of forming the impurity concentration gradient. Irrespective of the ion species to be implanted into the substrate, an impurity element is included in the atmosphere or a vicinity thereof upon synthesizing the single-crystal diamond. A small amount of gas may be introduced or a solid source material may be placed on a holder. In the substrate, a graphite layer is formed by ion implantation for subsequent electrochemical separation. Although the ion species to be implanted is not limited, carbon ion, boron ion, nitrogen ion, argon ion, phosphorous ion, silicon ion, sulfide ion, and the like are preferable. Among these, the carbon ion is more preferable since the graphite layer is formed. In the synthesis of the single-crystal diamond, it is preferable not to etch the substrate at an initial stage. In the surface of the substrate having ions implanted therein, crystal is interrupted, with the result that a single-crystal diamond with a multiplicity of crystal fluctuations and defects is synthesized thereon. As the synthesis of crystal proceeds, the crystal fluctuations are decreased to gradually form a single-crystal diamond having an excellent crystallinity. An impurity element is likely to be mixed in the crystal with a multiplicity of crystal fluctuations and defects, whereas when the crystal fluctuations are eliminated, the mixing of impurity element is decreased. In this way, the impurity concentration gradient is formed in the synthetic single-crystal diamond.

In the main surface of single-crystal diamond 20, the impurity concentration along the second direction (Y axis direction) orthogonal to the first direction (X axis direction) is preferably substantially uniform. Here, the expression "the impurity concentration is substantially uniform" means that the concentration falls within a range of −20% to +20% of the average value.

In single-crystal diamond 20, the impurity concentration along the depth direction, which is a direction perpendicular to the main surface, is preferably uniform. Here, the expression "the impurity concentration is uniform" means that the concentration falls within a range of −20% to +20% of the average value.

In the main surface of single-crystal diamond 20, the impurity concentration is preferably more than or equal to 10 ppb and less than or equal to 10000 ppm. When the impurity concentration is less than 10 ppb, a crack is likely to be propagated and a sufficient crack propagation suppressing effect is not obtained, thus resulting in decreased chipping resistance. On the other hand, when the impurity concentration is more than 10000 ppm, wear resistance is decreased remarkably. The impurity concentration is more preferably more than or equal to 100 ppb and less than or equal to 1000 ppm, and is further preferably more than or equal to 500 ppb and less than or equal to 100 ppm. The impurity concentration is a value measured by secondary ion mass spectrometry (SIMS).

In the main surface of single-crystal diamond 20, the maximum value of the impurity concentration is preferably more than or equal to 1 ppm and less than or equal to 10000 ppm, and is more preferably more than or equal to 5 ppm and less than or equal to 1000 ppm. Moreover, the minimum value of the impurity concentration is preferably more than or equal to 10 ppb and less than or equal to 100 ppm, and is more preferably more than or equal to 100 ppb and less than or equal to 50 ppm. A ratio (minimum value/maximum value) of the minimum value to the maximum value of the impurity concentration is preferably more than or equal to $10^{-6}$ and less than 0.8, and is more preferably more than or equal to $10^{-4}$ and less than or equal to 0.5. With this, when the single-crystal diamond is used as a material of a machining tool, uneven wear in material originating from the impurity concentration difference is canceled out by uneven wear originating from the plane orientation difference, whereby uneven wear can be prevented as a whole of the tool.

In single-crystal diamond 20, an angle of the side surface having the ion implantation layer relative to the main surface is preferably more than or equal to 55° and less than or equal to 125°. With this, the impurity concentration in the side surface can be made uniform. Here, the expression "the impurity concentration is uniform" means that the concentration falls within a range of −20% to +20% of the average value.

The impurity in the main surface of single-crystal diamond 20 preferably includes at least one element selected from a group consisting of nitrogen, boron, aluminum, silicon, phosphorus, and sulfur. This is because these impurities do not greatly disrupt the crystallinity of the diamond when mixed in the diamond and appropriately cause defects suitable for tool performance. Among them, the impurity preferably includes at least one of nitrogen and boron.

Figure 6A:
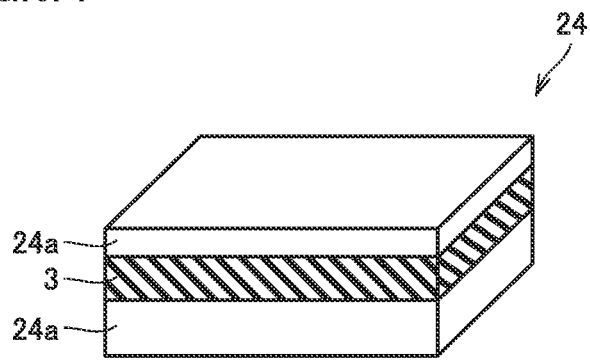
FIG. 6A shows one step of an exemplary method of producing the single-crystal diamond in the second embodiment.
Figure 6B:
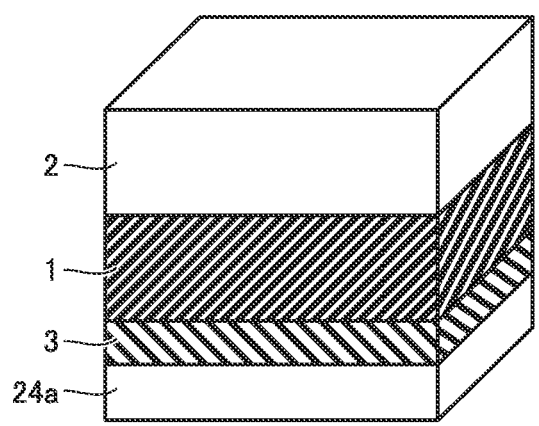
FIG. 6B shows a step, different from the foregoing step, of the exemplary method of producing the single-crystal diamond in the second embodiment.
Figure 6C:
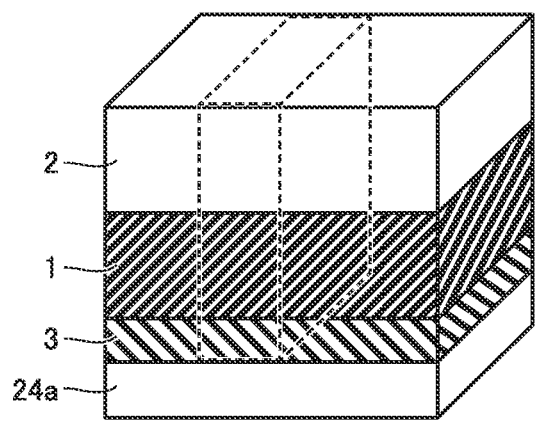
FIG. 6C shows a step, different from the foregoing step, of the exemplary method of producing the single-crystal diamond in the second embodiment.

The following describes a method of producing the single-crystal diamond in the second embodiment with reference to FIG. 6A to FIG. 6C. Each of FIG. 6A to FIG. 6C shows the exemplary method of producing the single-crystal diamond in the second embodiment. In the present embodiment, the method of producing the single-crystal diamond includes: obtaining, by a vapor deposition method, a synthetic single-crystal diamond in which an impurity concentration is changed along a crystal growth direction; and cutting the synthetic single-crystal diamond along the crystal growth direction.

First, as shown in FIG. 6A, a single-crystal diamond substrate 24 including ion implantation layer 3 at a certain depth from its main surface is prepared. Single-crystal diamond substrate 24 can be produced by performing ion implantation into a single-crystal substrate (type Ib) having a flat plate shape and composed of a diamond produced by the high temperature high voltage method, for example. Single-crystal diamond substrate 24 has a surface 24a in which the crystallinity of the single-crystal substrate before the ion implantation is maintained to such an extent that epitaxial growth can be performed by the vapor deposition method.

Implantation energy is preferably more than or equal to 80 keV and less than or equal to 10000 keV, and is more preferably more than or equal to 180 keV and less than or equal to 350 keV. An amount of irradiation is preferably more than or equal to $3 \times 10^{15}/cm^2$ and less than or equal to $5 \times 10^{17}/cm^2$, and is more preferably more than or equal to $1 \times 10^{16}/cm^2$ and less than or equal to $1 \times 10^{17}/cm^2$. When the implantation energy and amount of irradiation fall within the respective ranges, ion implantation layer 3 can be formed inside substrate 24 while maintaining the crystallinity of the main surface of substrate 24 to such an extent that epitaxial growth can be performed by the vapor deposition method.

As the ion to be implanted, at least one selected from a group consisting of carbon ion, boron ion, nitrogen ion, argon ion, phosphorous ion, silicon ion, and sulfur ion can be used.

Next, diamond single-crystal substrate 24 is placed in a chamber of a CVD apparatus, and the vapor deposition method is employed to obtain a synthetic single-crystal diamond having an impurity concentration changed along a crystal growth direction (FIG. 6B). Specifically, while introducing gas including carbon into the chamber, a synthetic single-crystal diamond is grown epitaxially on the main surface of single-crystal diamond substrate 24 through the CVD method.

The carbon in the gas serves as a carbon source for the synthetic diamond single crystal. Examples of the gas including carbon include $CH_4$, $C_2H_6$, $C_2H_4$, $C_2H_2$, $CH_3OH$, $C_2H_5OH$, $(CH_3)_2CO$, and the like. It should be noted that in addition to these gases, CO and $CO_2$ can also be used. Among these, it is preferable to use $CH_4$ because carbon radical to be a precursor of the formed diamond film is likely to be generated.

When growing the synthetic diamond single crystal on single-crystal diamond substrate 24, ions in ion implantation layer 3 are diffused into the synthetic diamond single crystal to serve as an impurity in the synthetic diamond. Therefore, as a distance from ion implantation layer 3 along the crystal growth direction is increased, the impurity concentration is gradually decreased in the synthetic diamond single crystal.

While introducing the above-described gas, pressure in the chamber is controlled to be, for example, 6.6 kPa to 26.6 kPa, microwave power is supplied to heat to an internal chamber temperature of 800° C. to 1200° C., and then the synthetic single-crystal diamond is epitaxially grown on the main surface of single-crystal diamond substrate 24. For a method of forming the epitaxial growth layer, a microwave plasma CVD method (MP-CVD method), a hot filament (HF) CVD method, a DC plasma method, or the like can be used, for example.

Next, as indicated by a broken line of FIG. 6C, the synthetic single-crystal diamond is cut along the crystal growth direction. The synthetic single-crystal diamond can be cut by laser cutting. Then, the synthetic single-crystal diamond is separated from single-crystal diamond substrate 24 by electrochemically etching ion implantation layer 3, thereby obtaining a single-crystal diamond. The obtained single-crystal diamond has, as a main surface, a surface parallel to the crystal growth direction of the synthetic single-crystal diamond and has a side surface provided with the ion implantation layer. Therefore, the impurity concentration is changed along the crystal growth direction in the main surface of the single-crystal diamond.

Third Embodiment

Figure 7A:
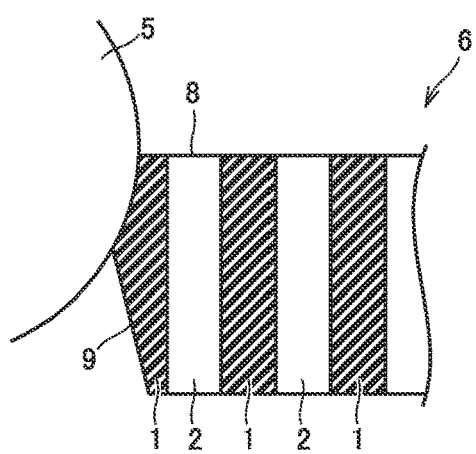
FIG. 7A illustrates a cutting bite of a third embodiment.
Figure 7B:
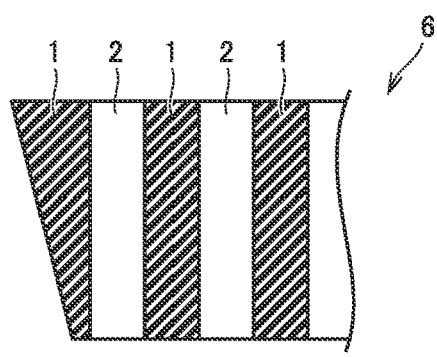
FIG. 7B illustrates the cutting bite of the third embodiment after cutting a workpiece 5.

The following describes a cutting bite of a third embodiment with reference to FIG. 7A to FIG. 7D. FIG. 7A shows cutting of a workpiece 5 using a cutting bite 6 of the third embodiment. FIG. 7B shows cutting bite 6 of the third embodiment after cutting workpiece 5.

Cutting bite 6 of the third embodiment is produced using single-crystal diamond 10 of the first embodiment. Specifically, cutting bite 6 is preferably produced to include: a rake face 8 constituted of the main surface of single-crystal diamond 10; and a flank face 9 constituted of a side surface of single-crystal diamond 10 parallel to the second direction (Y axis direction) orthogonal to the first direction (X axis direction) in the main surface. In other words, the amount of change of the impurity concentration of the single-crystal diamond in rake face 8 of the cutting bite is preferably larger than the amount of change of the impurity concentration of the single-crystal diamond in flank face 9 of the cutting bite.

Figure 7C:
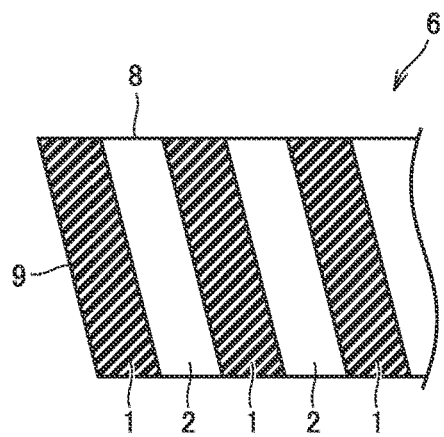
FIG. 7C illustrates the cutting bite of the third embodiment, in which an angle of a flank face 9 relative to a rake face 8 is more than or equal to 55° and less than or equal to 90°.
Figure 7D:
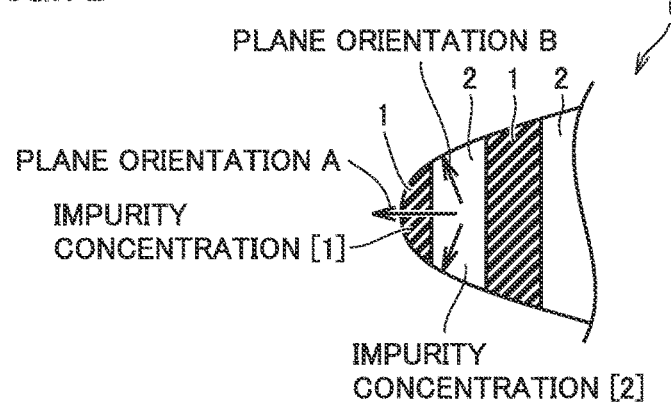
FIG. 7D is a top view of the cutting bite of the third embodiment.

In cutting bite 6, an angle of flank face 9 relative to rake face 8 is preferably more than or equal to 55° and less than or equal to 90°. For example, the angle of flank face 9 relative to rake face 8 can be adjusted to fall within the above-described range by laser-processing single-crystal diamond 10 such that an angle of the side surface relative to the main surface becomes more than or equal to 55° and less than or equal to 90°. As shown in FIG. 7C, it is preferable that the angle of flank face 9 relative to rake face 8 coincides with the angle of the plane with substantially uniform impurity concentration relative to the main surface. Moreover, as shown in a top view of the cutting bite in FIG. 7D, the direction of change of the impurity concentration may coincide with a plane orientation A of a curved surface of the tip of the tool. That is, when a wear rate in plane orientation A and a wear rate in plane orientation B in FIG. 7D satisfies A>B, a wear rate in a region with an impurity concentration [1] and a wear rate in a region with an impurity concentration [2] may be set to satisfy [1]<[2]. On the other hand, when A<B, it may be set to satisfy [1]>[2]. Furthermore, cyclicity in the concentration change is favorable because the concentration change is repeatedly produced in the same manner in the case where the tool is polished again for use.

As shown in FIG. 7A, when cutting workpiece 5 using cutting bite 6, only impurity high concentration region 1 of cutting bite 6 is in contact with workpiece 5. In impurity high concentration region 1, the impurity concentration is controlled to fall within a certain range, so that the crystallinity of the single-crystal diamond is substantially uniform. Therefore, when cutting workpiece 5, the workpiece can be machined uniformly without occurrence of uneven wear in flank face 9.

On the other hand, when a plurality of surfaces of cutting bite 6 having different plane orientations are in contact with the workpiece, the portions of cutting bite 6 with different impurity concentrations are preferably in contact with the workpiece. Accordingly, uneven wear can be prevented.

Fourth Embodiment

Figure 8A:
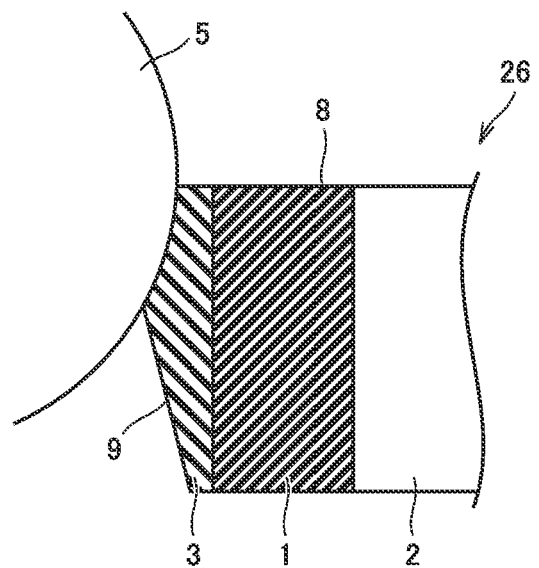
FIG. 8A illustrates a cutting bite of a fourth embodiment.
Figure 8B:
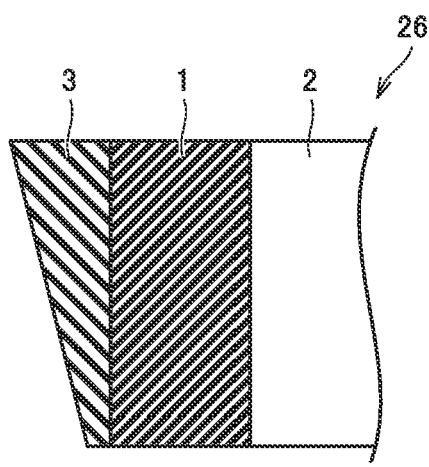
FIG. 8B illustrates the cutting bite of the fourth embodiment after cutting a workpiece 5.

The following describes a cutting bite of a fourth embodiment with reference to FIG. 8A to FIG. 8D. FIG. 8A shows cutting of a workpiece 5 using a cutting bite 26 of the fourth embodiment. FIG. 8B shows cutting bite 26 of the fourth embodiment after cutting workpiece 5.

Cutting bite 26 of the fourth embodiment is produced using single-crystal diamond 20 of the second embodiment. Specifically, cutting bite 26 is preferably produced to include: a rake face 8 constituted of the main surface of single-crystal diamond 20; and a flank face 9 constituted of a side surface of single-crystal diamond 20 at which ion implantation layer 3 is disposed. In other words, the amount of change of the impurity concentration of the single-crystal diamond in the rake face of the cutting bite is preferably larger than the amount of change of the impurity concentration of the single-crystal diamond in the flank face of the cutting bite.

Figure 8C:
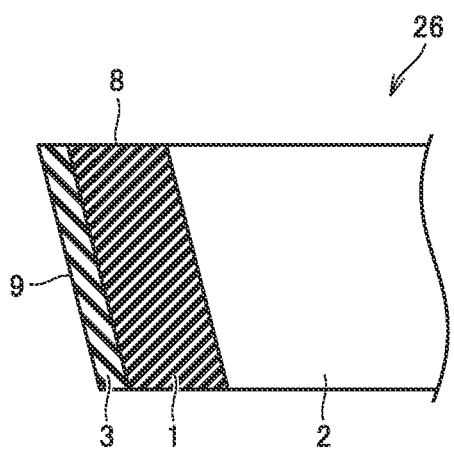
FIG. 8C illustrates the cutting bite of the fourth embodiment, in which an angle of a flank face 9 relative to a rake face 8 is more than or equal to 55° and less than or equal to 90°.
Figure 8D:
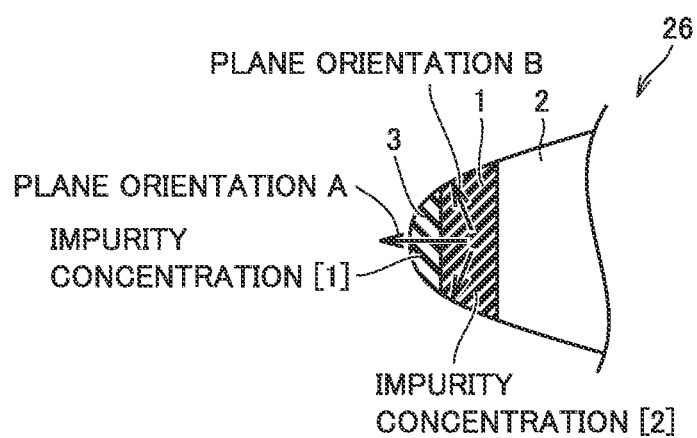
FIG. 8D is a top view of the cutting bite of the fourth embodiment.

In cutting bite 26, an angle of flank face 9 relative to rake face 8 is preferably more than or equal to 55° and less than or equal to 90°. For example, the angle of flank face 9 relative to rake face 8 can be adjusted to fall within the above-described range by laser-processing single-crystal diamond 20 such that an angle of the side surface at which ion implantation layer 3 is disposed relative to the main surface becomes more than or equal to 55° and less than or equal to 90°. As shown in FIG. 8C, it is preferable that the angle of flank face 9 relative to rake face 8 coincides with the angle of the plane with substantially uniform impurity concentration relative to the main surface. Moreover, as shown in a top view of the cutting bite in FIG. 8D, the direction of change of the impurity concentration may coincide with a plane orientation A of a curved surface of the tip of the tool. That is, when a wear rate in plane orientation A and a wear rate in plane orientation B in FIG. 8D satisfy A>B, a wear rate in a region with an impurity concentration [1] and a wear rate in a region with an impurity concentration [2] may be set to satisfy [1]<[2]. On the other hand, when A<B, it may be set to satisfy [1]>[2]. Furthermore, cyclicity in the concentration change is favorable because the concentration change is repeatedly produced in the same manner in the case where the tool is polished again for use.

As shown in FIG. 8A, when cutting workpiece 5 using cutting bite 26, only ion implantation layer 3 of cutting bite 26 is in contact with workpiece 5. In ion implantation layer 3, the impurity concentration is controlled to fall within a certain range, so that the crystallinity of the single-crystal diamond is substantially uniform. Therefore, when cutting workpiece 5, the workpiece can be machined uniformly without occurrence of uneven wear in flank face 9.

On the other hand, when a plurality of surfaces of cutting bite 6 having different plane orientations are in contact with the workpiece, the portions of cutting bite 6 with different impurity concentrations are preferably in contact with the workpiece. Accordingly, uneven wear can be prevented.

Fifth Embodiment

Figure 9A:
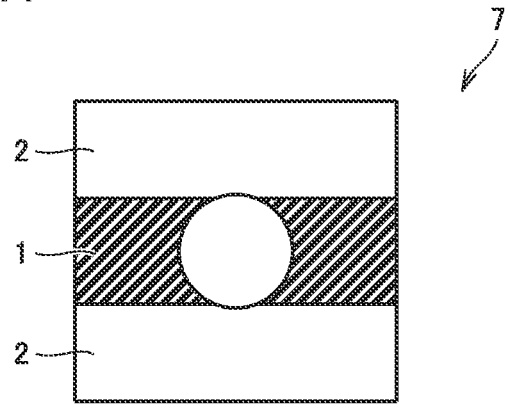
FIG. 9A illustrates a wire drawing die of a fifth embodiment.
Figure 9B:
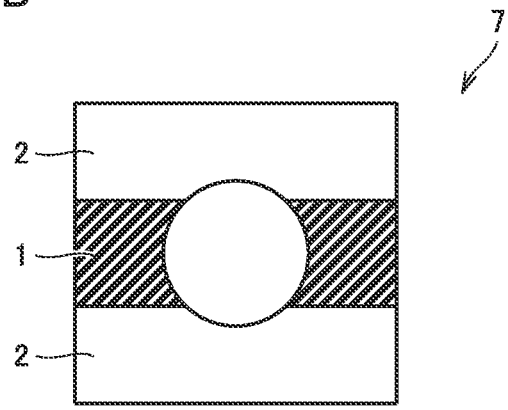
FIG. 9B illustrates the wire drawing die of the fifth embodiment after using the wire drawing die for wire drawing.
Figure 9C:
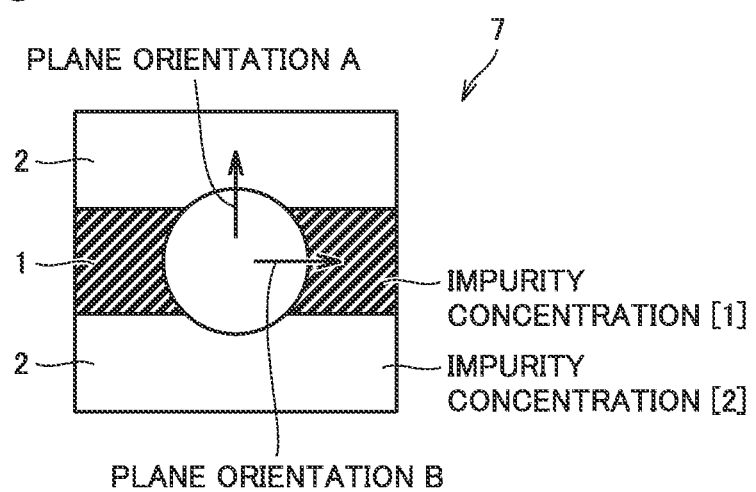
FIG. 9C illustrates the wire drawing die of the fifth embodiment together with a region having an impurity concentration [1] and a region having an impurity concentration [2].

The following describes a wire drawing die of a fifth embodiment with reference to FIG. 9A to FIG. 9C. FIG. 9A is a plan view of a wire drawing die 7 of the fifth embodiment. FIG. 9B shows wire drawing die 7 of the fifth embodiment after being used for wire drawing.

Wire drawing die 7 of the fifth embodiment is produced using single-crystal diamond 10 of the first embodiment. Specifically, wire drawing die 7 preferably has main surfaces corresponding to the main surfaces of single-crystal diamond 10, and is preferably provided with a through hole extending between the pair of main surfaces thereof along the direction perpendicular to each of the main surfaces of single-crystal diamond 10.

In wire drawing die 7, the center of the hole is located in impurity high concentration region 1. In a circumference defining the outer edge of the hole on the main surface, two farthest points from the center of the hole along the second direction (Y axis direction) of single-crystal diamond 10 are preferably located in impurity high concentration region 1 of single-crystal diamond 10, and two farthest points from the center of the hole along the first direction (X axis direction) of single-crystal diamond 10 are preferably located in impurity low concentration regions 2 of the main surface of single-crystal diamond 10. In this way, uneven wear of wire drawing die 7 can be suppressed during wire drawing using wire drawing die 7. Therefore, also in wire drawing die 7 after the wire drawing, the roundness of the hole is unlikely to be compromised, thereby maintaining the circular outer edge of the hole in the main surface.

In wire drawing die 7, the center of the hole is preferably located on a symmetry axis of impurity high concentration region 1 of single-crystal diamond 10 along the second direction (Y axis direction). Moreover, the impurity concentration in the main surface of wire drawing die 7 along the first direction (X axis direction) is preferably changed symmetrically with respect to a symmetry axis represented by a line passing through the center of the hole and along the second direction (Y axis direction). In this way, uneven wear of wire drawing die 7 can be suppressed effectively during wire drawing using wire drawing die 7.

Preferably, impurity high concentration region 1 and impurity low concentration region 2 have different optical transmittances. This is because the respective positions of the impurity regions can be numerically identified using a laser or optical microscope and the hole can be formed in a desired one of the positions of the impurity regions. Even when the optical transmittances are similar, the hole can be formed in a desired one of the impurity high concentration region and the impurity low concentration region as long as the geometric center of the main surface is made identifiable as to whether it is in the impurity high concentration region or the impurity low concentration region.

In the description above, in the main surface of wire drawing die 7, impurity high concentration region 1 is interposed between impurity low concentration regions 2; however, the arrangement of impurity high and low concentration regions 1 and 2 may be opposite thereto.

As shown in FIG. 9C, in wire drawing die 7, when the wear rate in the region with the impurity concentration [1]

and the wear rate in the region with the impurity concentration [2] satisfy [1]<[2], the wear rate in plane orientation A and the wear rate in plane orientation B preferably satisfy [B]>[A]. On the other hand, when [1]>[2], [B]<[A] is preferable. Here, the region with the impurity concentration [1] may be impurity high concentration region 1 or may be impurity low concentration region 2. With this, uneven wear of wire drawing die 7 can be suppressed during wire drawing using wire drawing die 7. Therefore, also in wire drawing die 7 after the wire drawing, the roundness of the hole is unlikely to be compromised, thereby maintaining the circular outer edge of the hole in the main surface.

EXAMPLES

The following describes the present invention more specifically by way of Examples. However, the present invention is not limited by these Examples.

Figure 10A:
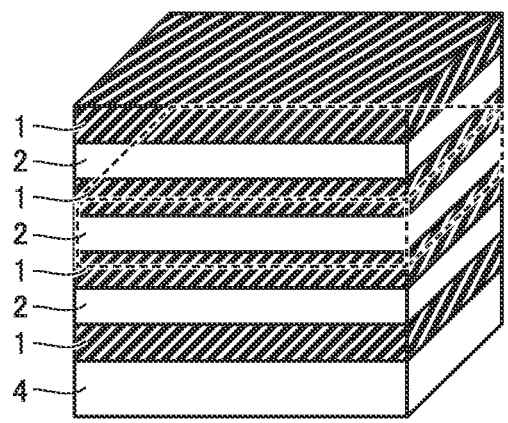
FIG. 10A shows one step of an exemplary method of producing a single-crystal diamond in each of samples 50, 51, 60, and 61.
Figure 10B:
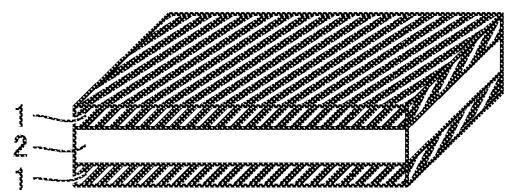
FIG. 10B shows a step, different from the foregoing step, of an exemplary method of producing a single-crystal diamond in each of samples 50, 51, 60, and 61.

In each of samples 1 to 4, the obtained synthetic single-crystal diamond was cut along a direction perpendicular to a plane with a uniform impurity concentration (see FIG. 3C), thereby obtaining a single-crystal diamond having a thickness of 0.8 mm. In each of samples 50 and 51, the obtained synthetic single-crystal diamond was cut along the direction parallel to the plane with the uniform impurity concentration (see FIG. 10A), thereby obtaining a single-crystal diamond having a thickness of 0.8 mm. In a sample 52, a single-crystal diamond was grown without introducing the nitrogen gases, and then a single-crystal diamond having a thickness of 0.8 mm was cut out.

In each of the main surfaces of the obtained single-crystal diamonds, a content of nitrogen atoms (impurity) relative to carbon atoms was measured by the secondary ion mass spectrometry. A result thereof is shown in Table 1.

TABLE 1

| Sample | Concentration Difference of Impurity in Main Surface | Impurity | Maximum Density of Impurity High Concentration Region (ppm) | Minimum Concentration of Impurity Low Concentration Region (ppb) | Width of Impurity High Concentration Region (μm) | Width of Impurity Low Concentration Region (μm) |
|---|---|---|---|---|---|---|
| 1 | Strip Form | Nitrogen | 90 | 400 | 50 ± 5 | 50 ± 5 |
| 2 | Strip Form | Nitrogen | 90 | 400 | 500 ± 10 | 500 ± 10 |
| 3 | Strip Form | Nitrogen | 90 | 400 | 30 ± 5 | 30 ± 5 |
| 4 | Strip Form | Nitrogen | 90 | 400 | 60 ± 5 | 60 ± 5 |
| 50 | Uniform | Nitrogen | 90 | 400 | 50 ± 5 | 50 ± 5 |
| 51 | Uniform | Nitrogen | 90 | 400 | 30 ± 5 | 30 ± 5 |
| 52 | Uniform | Nitrogen | 90 | — | — | — |

Example 1

(Single-Crystal Diamond)

An artificial type Ib single-crystal {100} substrate having a size of 5 mm×5 mm and having a thickness of 0.5 mm was prepared, and epitaxial growth was performed thereon by the microwave plasma CVD method. The epitaxial growth was performed at a substrate temperature of 1100° C. and a pressure of 100 torr. 150 sccm (Standard Cubic cm) of methane gas and 1000 sccm of hydrogen gas were introduced. The single-crystal diamond was grown to have a thickness falling within a range of 0.7 mm to 1 mm.

For nitrogen gas to be added during the growth of the single-crystal diamond, 100% nitrogen gas or 1% nitrogen gas diluted with hydrogen was used. The 100% nitrogen gas and the 1% nitrogen gas were introduced alternately. While one of the nitrogen gases was supplied, the flow rate of the other one of the nitrogen gases was set at zero. By changing the flow rate (0.1 to 5 sccm) of each nitrogen gas and an introduction time thereof, the impurity concentration in the growth film was controlled.

In each of the main surfaces of samples 1 to 4, nitrogen high concentration regions and nitrogen low concentration regions were distributed repeatedly.

In sample 52 obtained under the same impurity high concentration condition of each of samples 1 to 4, an isolated substitutional nitrogen concentration was confirmed by electron spin resonance (ESR) to be 800 ppb, which was less than or equal to 1% of the total nitrogen.

(Cutting Bite)

Cutting bites were produced using the single-crystal diamonds of samples 1, 2, and 50. Specifically, as shown in FIG. 7A to FIG. 7D, each of the cutting bites was produced to include: a rake face constituted of the main surface of the single-crystal diamond; and a flank face constituted of a side surface of the single-crystal diamond parallel to a direction (Z axis direction) orthogonal to the first direction (X axis direction) in the main surface. The cutting bites each had a tip angle of 80°. Tips R, tip positions, and center positions for the tip diameters in the cutting bites are as shown in Table 2.

TABLE 2

| Sample | Orientation of Crystal Plane in Direction in which Impurity is Uniform | Cutting Bite (Initial Roundness of 0.15 μm) | | | |
|---|---|---|---|---|---|
| | | Tip R (μm) | Tip Position | Center Position for Tip Diameter | Roundness After Test (μm) |
| 1 | <110> | 50 | Low Concentration Region | High Concentration Region | 0.25 |

TABLE 2-continued

| Sample | Orientation of Crystal Plane in Direction in which Impurity is Uniform | Cutting Bite (Initial Roundness of 0.15 μm) | | | |
|---|---|---|---|---|---|
| | | Tip R (μm) | Tip Position | Center Position for Tip Diameter | Roundness After Test (μm) |
| | <100> | 50 | High Concentration Region | Low Concentration Region | 0.21 |
| 2 | <110> | 700 | Low Concentration Region | High Concentration Region | 0.22 |
| | <100> | 700 | High Concentration Region | Low Concentration Region | 0.20 |
| 50 | — | 50 | Substantial Center of Main Surface | — | 0.30 |

The obtained cutting bites were used to perform cutting under the following conditions.
Workpiece: A4032 (Al—Si-based material)
Cutting speed: 600 m/min
Cutting distance: 20 km
Feed rate: 2 μm/rev
Machining allowance: 2 μm The cutting bites of samples 1 and 2 were uniformly worn and were not chipped. The workpiece was machined uniformly smoothly and had no damage. Further, when the curved surfaces of the rake faces of samples 1 and 2 were observed, the roundnesses of the curved surfaces before the machining were maintained. That is, uneven wear in each of the curved surfaces of the rake faces of samples 1 and 2 was very small.

As compared with samples 1 and 2, the surface of the workpiece cut by the cutting bite of sample 50 was rough. When the rake face was observed, the curved surface was very unevenly worn as compared with the curved surface before the machining.

(Wire Drawing Die)

Wire drawing dies were produced using the single-crystal diamonds of samples 3, 4, 51, and 52. Specifically, as shown in FIG. 9A to FIG. 9C, each of the wire drawing dies preferably had a main surface corresponding to a main surface of the single-crystal diamond, and was preferably provided with a through hole extending between the pair of main surfaces thereof facing each other along the direction perpendicular to each of the main surfaces of the single-crystal diamond. The hole diameter and the center position of the hole are as shown in Table 3.

The obtained wire drawing dies were used to perform wire drawing under the following conditions.
Wire drawing material: SUS306
Wire drawing speed: 600 m/min
Wire drawing distance: 20 km Each of the wire drawing dies of samples 3 and 4 was uniformly worn and uneven wear in the hole was very small. The wire drawing material was machined uniformly smoothly and had no damage.

Uneven wear in the hole of each of the wire drawing dies of samples 51 and 52 was large (roundness became larger).

Example 2

(Single-Crystal Diamond)

An artificial type Ib single-crystal {100} substrate having a size of 5 mm×5 mm and having a thickness of 0.5 mm was prepared, and epitaxial growth was performed thereon by the microwave plasma CVD method. The epitaxial growth was performed at a substrate temperature of 1100° C. and a pressure of 100 torr. 150 sccm (Standard Cubic cm) of methane gas and 1000 sccm of hydrogen gas were introduced. The single-crystal diamond was grown to have a thickness falling within a range of 0.7 mm to 1 mm.

Diborane gas (100 ppm; diluted with hydrogen) to be added during the growth of the single-crystal diamond was introduced at flow rates of 5 sccm and 0 sccm alternately and repeatedly with respective introduction times being controlled.

In each of samples 11 to 14, the obtained synthetic single-crystal diamond was cut along a direction perpen-

TABLE 3

| Sample | Axial Direction of Die Hole | Orientation of Crystal Plane in Direction in which Impurity is Uniform | Wire Drawing Die (Initial Roundness of 0.12 μm) | | |
|---|---|---|---|---|---|
| | | | Hole Diameter (μm) | Center Position of Hole | Roundness After Test (μm) |
| 3 | <−110> | <110> | 40 | Center of High Concentration Region | 0.20 |
| | <−110> | <001> | 40 | Center of Low Concentration Region | 0.17 |
| 4 | <−110> | <110> | 75 | Center of High Concentration Region | 0.18 |
| | <−110> | <001> | 75 | Center of Low Concentration Region | 0.16 |
| 51 | <001> | — | 40 | Substantial Center of Main Surface | 0.27 |
| 52 | <−110> | — | 40 | Substantial Center of Main Surface | 0.24 | dicular to a plane with a uniform impurity concentration (see FIG. 3C), thereby obtaining a single-crystal diamond having a thickness of 0.8 mm. In each of samples 60 and 61, the obtained synthetic single-crystal diamond was cut along the direction parallel to the plane with a uniform impurity concentration (see FIG. 10A), thereby obtaining a single-crystal diamond having a thickness of 0.8 mm. In a sample 62, a single-crystal diamond was grown without introducing the diborane gas, and then a single-crystal diamond having a thickness of 0.8 mm was cut out.

In each of the main surfaces of the obtained single-crystal diamonds, a content of boron atoms (impurity) relative to carbon atoms was measured by the secondary ion mass spectrometry. A result thereof is shown in Table 4.

The obtained cutting bites were used to perform cutting under the following conditions.
Workpiece: A4032 (Al—Si-based material)
Cutting speed: 600 m/min
Cutting distance: 20 km
Feed rate: 2 μm/rev
Machining allowance: 2 μm The cutting bites of samples 11 and 12 were uniformly worn and were not chipped. The workpiece was machined uniformly smoothly and had no damage. Further, when the curved surfaces of the rake faces of samples 11 and 12 were observed, the roundnesses of the curved surfaces before the machining were maintained. That is, uneven wear in the curved surfaces of the rake faces of samples 1 and 2 were very small.

TABLE 4

| Sample | Concentration Difference of Impurity in Main Surface | Impurity | Maximum Density of Impurity High Concentration Region (ppm) | Minimum Concentration of Impurity Low Concentration Region (ppb) | Width of Impurity High Concentration Region (μm) | Width of Impurity Low Concentration Region (μm) |
|---|---|---|---|---|---|---|
| 11 | Strip Form | Boron | 500 | 80 | 40 ± 4 | 40 ± 4 |
| 12 | Strip Form | Boron | 500 | 50 | 600 ± 6 | 600 ± 6 |
| 13 | Strip Form | Boron | 500 | 80 | 32 ± 4 | 24 ± 4 |
| 14 | Strip Form | Boron | 500 | 50 | 50 ± 4 | 55 ± 3 |
| 60 | Uniform | Boron | 500 | 80 | 40 ± 4 | 40 ± 4 |
| 61 | Uniform | Boron | 500 | 80 | 32 ± 4 | 24 ± 4 |
| 62 | Uniform | Boron | 500 | — | — | — |

In each of the main surfaces of samples 11 to 14, boron high concentration regions and boron low concentration regions were distributed repeatedly.

(Cutting Bite)

Cutting bites were produced using the single-crystal diamonds of samples 11, 12, and 60. Specifically, as shown in FIG. 7A to FIG. 7D, each of the cutting bites was produced to include: a rake face constituted of the main surface of the single-crystal diamond; and a flank face constituted of a side surface of the single-crystal diamond parallel to a direction (Z axial direction) orthogonal to the first direction (X axis direction) in the main surface. The cutting bites each had a tip angle of 80°. Tips R, tip positions, and center positions for the tip diameters in the cutting bites are as shown in Table 5.

As compared with samples 11 and 12, the surface of the workpiece cut by the cutting bite of sample 60 was rough. When the rake face was observed, the curved surface was very unevenly worn as compared with the curved surface before the machining.

(Wire Drawing Die)

Wire drawing dies were produced using the single-crystal diamonds of samples 13, 14, 61, and 62. Specifically, as shown in FIG. 9A to FIG. 9C, each of the wire drawing dies had a main surface corresponding to the main surface of the single-crystal diamond, and was provided with a through hole extending between the pair of main surfaces thereof facing each other along the direction perpendicular to each of the main surfaces of the single-crystal diamond. The hole diameter and the center position of the hole are as shown in Table 6.

TABLE 5

| Sample | Orientation of Crystal Plane in Direction in which Impurity is Uniform | Tip R (μm) | Cutting Bite (Initial Roundness of 0.15 μm) | | Roundness After Test (μm) |
|---|---|---|---|---|---|
| | | | Tip Position | Center Position of Tip Diameter | |
| 11 | <110> | 50 | Low Concentration Region | High Concentration Region | 0.26 |
| | <100> | 50 | High Concentration Region | Low Concentration Region | 0.22 |
| 12 | <110> | 700 | Low Concentration Region | High Concentration Region | 0.24 |
| | <100> | 700 | High Concentration Region | Low Concentration Region | 0.21 |
| 60 | — | 50 | Substantial Center of Main Surface | — | 0.33 |

TABLE 6

| Sample | Axial Direction of Die Hole | Orientation of Crystal Plane in Direction in which Impurity is Uniform | Wire Drawing Die (Initial Roundness of 0.12 μm) | | Roundness After Test (μm) |
| --- | --- | --- | --- | --- | --- |
| | | | Hole Diameter (μm) | Center Position of Hole | |
| 13 | <−110> | <110> | 40 | Center of High Concentration Region | 0.22 |
| | <−110> | <001> | 30 | Center of Low Concentration Region | 0.18 |
| 14 | <−110> | <110> | 60 | Center of High Concentration Region | 0.20 |
| | <−110> | <001> | 75 | Center of Low Concentration Region | 0.18 |
| 61 | <001> | — | 40 | Substantial Center of Main Surface | 0.29 |
| 62 | <−110> | — | 40 | Substantial Center of Main Surface | 0.27 |

Wire drawing was performed using the obtained wire drawing die under the following conditions.

Wire drawing material: SUS306
Wire drawing speed: 600 m/min
Wire drawing distance: 20 km Each of the wire drawing dies of samples 13 and 14 was uniformly worn and uneven wear in the hole was very small. The wire drawing material was machined uniformly smoothly and had no damage.

Uneven wear in the hole of each of the wire drawing dies of samples 61 and 62 was very large (roundness became larger).

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

The single-crystal diamond of the present invention is beneficial when used for tools, such as a cutting tool, a grinding tool, and a wear resisting tool.

REFERENCE SIGNS LIST

1: impurity high concentration region; 2: impurity low concentration region; 3: ion implantation layer; 4, 24: single-crystal diamond substrate; 5: workpiece; 6, 26: cutting bite; 7: wire drawing die; 8: rake face; 9: flank face; 10, 20: single-crystal diamond.

The invention claimed is:

1. A single-crystal diamond comprising a pair of main surfaces facing each other,
an impurity concentration being changed along a first direction in each of the main surfaces, wherein
the single-crystal diamond has an ion implantation layer at a side surface along a second direction, and
the second direction is direction orthogonal to the first direction,
the single crystal diamond includes the ion implantation layer, an impurity high concentration region, and an impurity low concentration region each extending along the second direction in a form of a strip disposed adjacent to one another in this order,
the impurity high concentration region is a region having an impurity concentration falling within a range of a maximum value to 60% of the maximum value and has a width falling within a range of more than or equal to 0.5 μm to less than or equal to 500 μm,
the impurity low concentration region is a region having an impurity concentration of less than 60% of the maximum value,
the impurity concentration of the single-crystal diamond ranges from more than or equal to 10 ppb to less than or equal to 10000 ppm,
the impurity concentration has cyclicity of the impurity high concentration region and the impurity low concentration region along the first direction, a distance of one cycle in each of the main surfaces is more than or equal to 0.1 μm and less than or equal to 1000 μm.

2. The single-crystal diamond according to claim 1, wherein in each of the main surfaces, the impurity concentration is substantially uniform along the second direction.

3. The single-crystal diamond according to claim 1, wherein in each of the main surfaces, the first direction and the second direction are different in crystal orientation.

4. The single-crystal diamond according to claim 1, wherein the impurity concentration has a centrosymmetry along the first direction.

5. The single-crystal diamond according to claim 1, wherein angles of the side surface relative to each of the main surfaces are more than or equal to 55° and less than or equal to 125°.

6. The single-crystal diamond according to claim 1, wherein the impurity includes at least one element selected from a group consisting of nitrogen, boron, aluminum, silicon, phosphorus, and sulfur.

7. A tool comprising the single-crystal diamond recited in claim 1.

8. The tool according to claim 7, wherein
the tool is a cutting bite, and
an amount of change of the impurity concentration of the single-crystal diamond in a flank face of the cutting bite is smaller than an amount of change of the impurity concentration of the single-crystal diamond in a rake face of the cutting bite.

9. The tool according to claim 7, wherein
the tool is a cutting bite, and
in a rake face of the cutting bite, the cutting bite has a relation to cancel out a wear rate difference originating from a plane orientation difference and a wear rate difference originating from an impurity concentration difference.

10. The tool according to claim 7, wherein
the tool is a wire drawing die, and
a through hole is formed to extend between the pair of main surfaces of the single-crystal diamond facing each other, along a direction perpendicular to each of the main surfaces of the single-crystal diamond.

11. The tool according to claim 7, wherein
the tool is a wire drawing die, and
in a direction parallel to each of the main surfaces of the single-crystal diamond, the wire drawing die has a relation to cancel out a wear rate difference originating from a plane orientation difference and a wear rate difference originating from an impurity concentration difference.

12. A method of producing the single-crystal diamond recited in claim 1, the method comprising:
obtaining, by a vapor deposition method, a synthetic single-crystal diamond in which an impurity concentration is changed along a crystal growth direction; and
cutting the synthetic single-crystal diamond in a direction in which the impurity concentration is changed, thereby obtaining the single-crystal diamond of claim 1.

* * * * *